(12) United States Patent
Kontani et al.

(10) Patent No.: US 8,047,158 B2
(45) Date of Patent: Nov. 1, 2011

(54) SUBSTRATE PROCESSING APPARATUS AND REACTION CONTAINER

(75) Inventors: Tadashi Kontani, Tokyo (JP); Kazuyuki Toyoda, Tokyo (JP); Taketoshi Sato, Tokyo (JP); Toru Kagaya, Tokyo (JP); Nobuhito Shima, Tokyo (JP); Nobuo Ishimaru, Tokyo (JP); Masanori Sakai, Tokyo (JP); Kazuyuki Okuda, Tokyo (JP); Yasushi Yagi, Tokyo (JP); Seiji Watanabe, Tokyo (JP); Yasuo Kunii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 11/933,169

(22) Filed: Oct. 31, 2007

(65) Prior Publication Data

US 2008/0251014 A1  Oct. 16, 2008

Related U.S. Application Data

(63) Continuation of application No. 10/406,279, filed on Apr. 4, 2003, now abandoned.

(30) Foreign Application Priority Data

Apr. 5, 2002 (JP) .................. 2002-104011
Jul. 12, 2002 (JP) .................. 2002-203397

(51) Int. Cl.
*C23C 16/509* (2006.01)
*C23C 16/505* (2006.01)
*C23C 16/503* (2006.01)
*C23C 16/50* (2006.01)
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. .......... 118/723 E; 118/723 R; 118/723 ER; 156/345.43; 156/345.44; 156/345.45; 156/345.55

(58) Field of Classification Search ............... 118/723 E, 118/723 R, 723 ER; 156/345.43, 345.44, 156/345.45, 345.55

See application file for complete search history.

(56) References Cited

U.S. PATENT DOCUMENTS 3,644,191 A * 2/1972 Matsushima ............ 204/298.06

(Continued)

FOREIGN PATENT DOCUMENTS

CN         1274823 A    11/2000

(Continued)

OTHER PUBLICATIONS

Machine Translation for JP09055372. Japanese Patent Office. http://www4.ipdl.inpit.go.jp/Tokujitu/PAJdetail.ipdl?N0000=60&N0120=01&N2001=2&N3001=H09-055372.*

*Primary Examiner* — Rudy Zervigon

(74) *Attorney, Agent, or Firm* — Birch, Stewart, Kolasch & Birch, LLP

(57) ABSTRACT

A substrate processing apparatus comprises a reaction chamber which is to accommodate stacked substrates, a gas introducing portion, and a buffer chamber, wherein the gas introducing portion is provided along a stacking direction of the substrates, and introduces substrate processing gas into the buffer chamber, the buffer chamber includes a plurality of gas-supply openings provided along the stacking direction of the substrates, and the processing gas introduced from the gas introducing portion is supplied from the gas-supply openings to the reaction chamber.

11 Claims, 12 Drawing Sheets

U.S. PATENT DOCUMENTS

| | | | | |
|---|---|---|---|---|
| 4,096,822 | A * | 6/1978 | Yamawaki et al. | 118/729 |
| 4,401,689 | A * | 8/1983 | Ban | 427/589 |
| 4,499,853 | A * | 2/1985 | Miller | 118/725 |
| 4,612,207 | A * | 9/1986 | Jansen | 427/576 |
| 4,657,616 | A * | 4/1987 | Benzing et al. | 156/345.43 |
| 4,747,368 | A * | 5/1988 | Brien et al. | 118/715 |
| 4,854,266 | A * | 8/1989 | Simson et al. | 118/728 |
| 5,217,560 | A * | 6/1993 | Kurono et al. | 156/345.43 |
| 5,279,670 | A * | 1/1994 | Watanabe et al. | 118/725 |
| 5,383,984 | A * | 1/1995 | Shimada et al. | 156/345.26 |
| 5,558,719 | A * | 9/1996 | Tsuchida et al. | 118/723 E |
| 5,567,243 | A * | 10/1996 | Foster et al. | 118/730 |
| 5,618,349 | A * | 4/1997 | Yuuki | 118/715 |
| 5,647,912 | A * | 7/1997 | Kaminishizono et al. | 118/719 |
| 5,739,069 | A * | 4/1998 | Usui et al. | 438/710 |
| 5,770,098 | A * | 6/1998 | Araki et al. | 216/67 |
| 5,811,022 | A * | 9/1998 | Savas et al. | 216/68 |
| 5,925,188 | A * | 7/1999 | Oh | 118/715 |
| 6,135,053 | A * | 10/2000 | Okamura | 118/723 E |
| 6,140,773 | A * | 10/2000 | Anders et al. | 315/111.21 |
| 6,143,129 | A * | 11/2000 | Savas et al. | 156/345.48 |
| 6,145,469 | A * | 11/2000 | Teranishi et al. | 118/723 E |
| 6,146,461 | A * | 11/2000 | Yang et al. | 118/715 |
| 6,388,381 | B2 * | 5/2002 | Anders | 315/111.21 |
| 6,402,849 | B2 * | 6/2002 | Kwag et al. | 118/715 |
| 6,424,091 | B1 | 7/2002 | Sawada et al. | |
| 6,446,572 | B1 * | 9/2002 | Brcka | 118/723 ER |
| 6,500,500 | B1 * | 12/2002 | Okamura | 427/569 |
| 6,558,507 | B1 * | 5/2003 | Teranishi et al. | 156/345.45 |
| 7,861,668 | B2 * | 1/2011 | Toyoda et al. | 118/723 E |
| 2001/0025605 | A1* | 10/2001 | Nagakura | 118/715 |
| 2002/0124800 | A1* | 9/2002 | Moriyama | 118/715 |
| 2002/0134507 | A1 | 9/2002 | DeDontney et al. | |
| 2002/0153103 | A1* | 10/2002 | Madocks | 156/345.46 |
| 2003/0049372 | A1* | 3/2003 | Cook et al. | 427/248.1 |
| 2003/0164143 | A1* | 9/2003 | Toyoda et al. | 118/723 E |
| 2004/0025786 | A1* | 2/2004 | Kontani et al. | 118/715 |
| 2005/0287775 | A1* | 12/2005 | Hasebe et al. | 438/503 |
| 2006/0124058 | A1* | 6/2006 | Sakai et al. | 118/715 |
| 2007/0234961 | A1* | 10/2007 | Takahashi et al. | 118/723 R |
| 2007/0246355 | A1* | 10/2007 | Toyoda et al. | 204/298.02 |
| 2008/0066681 | A1* | 3/2008 | Toyoda et al. | 118/723 R |
| 2008/0093215 | A1* | 4/2008 | Toyoda et al. | 204/298.02 |
| 2008/0121180 | A1* | 5/2008 | Kontani et al. | 118/723 R |
| 2008/0251014 | A1* | 10/2008 | Kontani et al. | 118/715 |
| 2008/0251015 | A1* | 10/2008 | Kontani et al. | 118/715 |
| 2008/0286980 | A1* | 11/2008 | Ishimaru | 438/716 |
| 2009/0023301 | A1* | 1/2009 | Ookoshi | 438/792 |
| 2009/0133630 | A1* | 5/2009 | Toyoda et al. | 118/723 ER |
| 2009/0151632 | A1* | 6/2009 | Okuda et al. | 118/666 |
| 2009/0159440 | A1* | 6/2009 | Toyoda et al. | 204/298.07 |
| 2009/0197425 | A1* | 8/2009 | Ishimaru | 438/761 |
| 2010/0258530 | A1* | 10/2010 | Toyoda et al. | 216/84 |
| 2010/0263593 | A1* | 10/2010 | Kontani et al. | 118/723 HC |

FOREIGN PATENT DOCUMENTS

| | | | |
|---|---|---|---|
| JP | 62-245626 A | | 10/1987 |
| JP | 5-6858 A | | 1/1993 |
| JP | 05-055150 | | 3/1993 |
| JP | 5-251391 | | 9/1993 |
| JP | 6-349761 A | | 12/1994 |
| JP | 7-130673 A | | 5/1995 |
| JP | 08-199359 | | 8/1996 |
| JP | 09-055372 | * | 2/1997 |
| JP | 09055372 A | * | 2/1997 |
| JP | 2003-297818 | | 10/2003 |

* cited by examiner

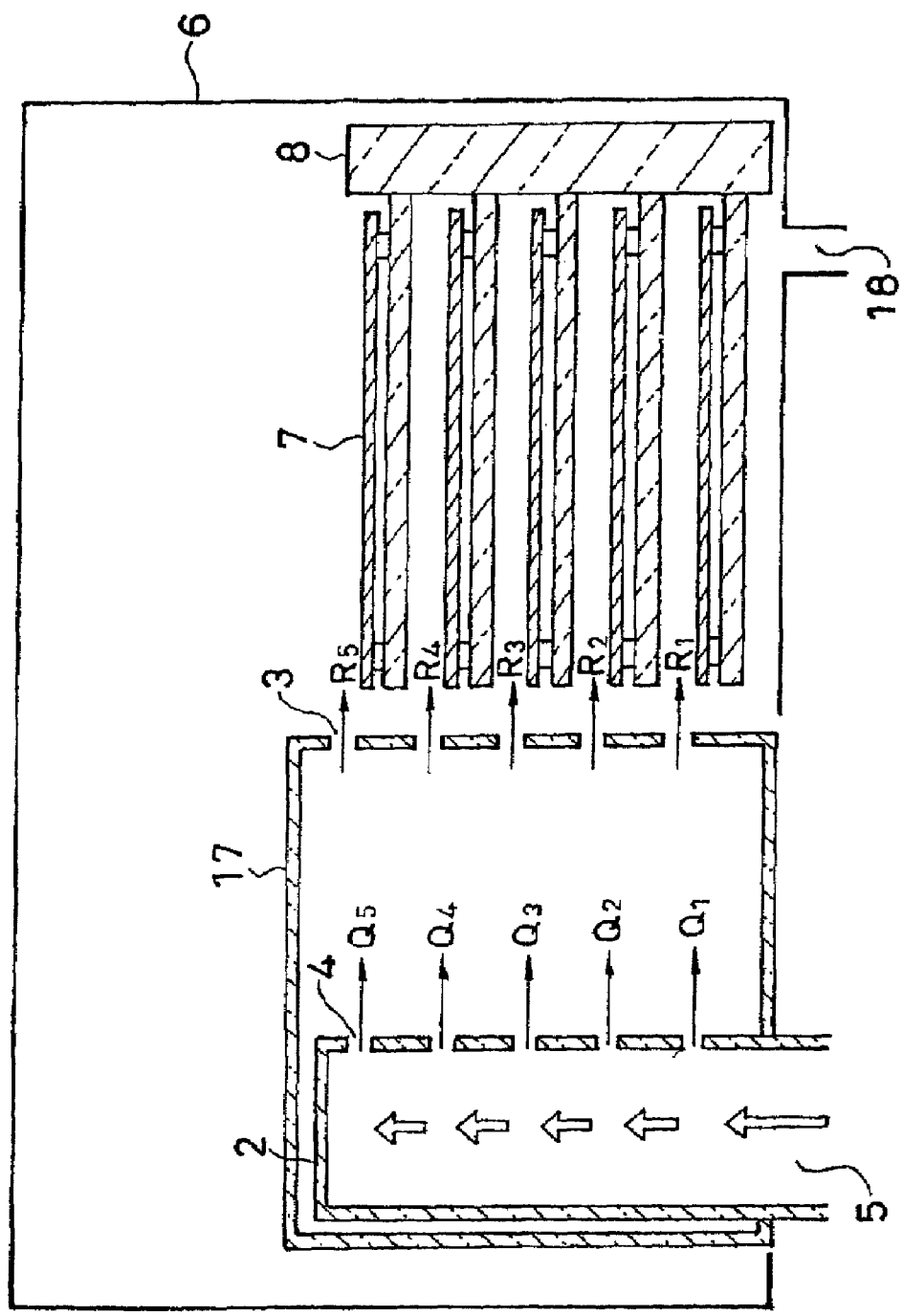

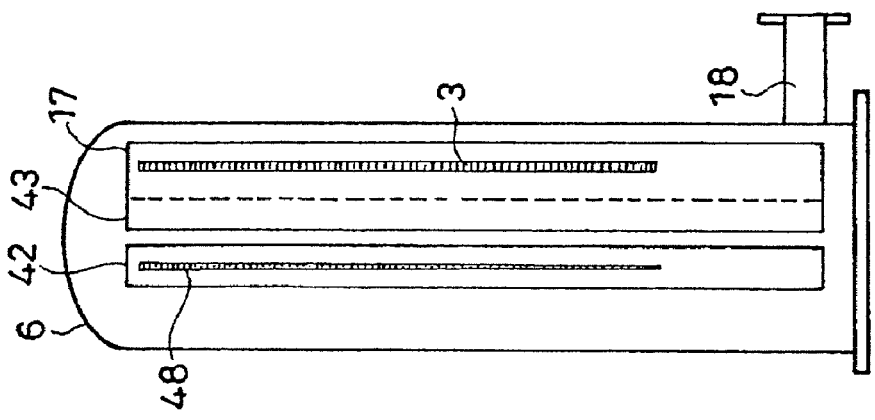
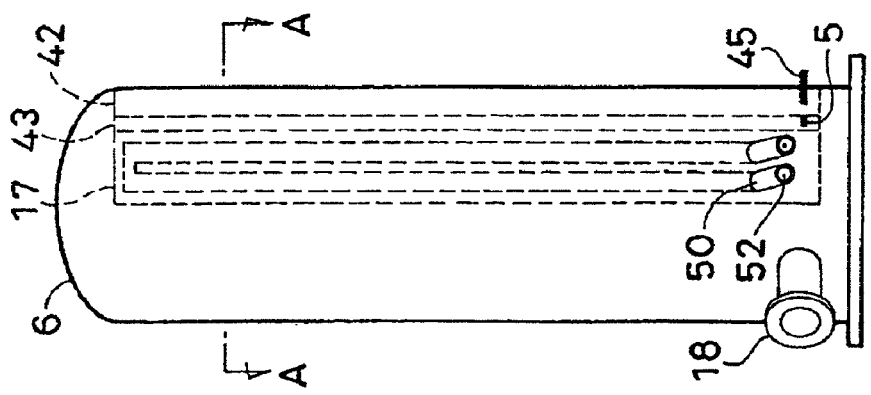

SUBSTRATE PROCESSING APPARATUS AND REACTION CONTAINER

This application is a Continuation of application Ser. No. 10/406,279, filed on Apr. 4, 2003 now abandoned, the entire contents of which are hereby incorporated by reference and for which priority is claimed under 35 U.S.C. §120.

BACKGROUND OF THE INVENTION

1. Field of the Invention

The present invention relates to a substrate processing apparatus and a reaction container, more particularly, to a substrate processing apparatus and a reaction container used in one step of producing process of a semiconductor device for processing a substrate in a reaction chamber, and more particularly, to an improvement of a gas introducing portion which supplies gas to a substrate.

2. Description of the Related Art

A conventional technique for processing a substrate in a reaction chamber by a CVD (Chemical Vapor Deposition) method or an ALD (Atomic Layer Deposition) method will be briefly explained with reference to FIG. 14 while taking a vertical type substrate processing apparatus as an example.

FIG. 14 is a schematic sectional view of the inside of a reaction tube which is a reaction chamber in the conventional vertical type substrate processing apparatus.

A plurality of wafers 107 are stacked on a boat 108 as substrates to be processed. The boat 108 is inserted into a reaction tube 106. A gas nozzle 101 as a gas introducing portion for processing the wafers 107 in the reaction tube 106 is provided in the reaction tube 106.

The gas nozzle 101 is provided with a plurality of gas nozzle holes 103 (five in the example shown in FIG. 14). With this arrangement, processing gas flows into the gas nozzle 101 from a gas introducing opening 105, and is supplied to the wafers 107 from the gas nozzle holes 103.

The gas supplied to each wafer 107 passes through a process for forming a desired film on the wafer 107 and then, is discharged out from the reaction tube 106 through an exhaust opening 118.

However, when all of the gas nozzle holes 103 provided in the gas nozzle 101 have the same opening areas, there is a problem that a flow rate and flow velocity of gas supplied from the gas nozzle holes 103 to the wafers 107 are reduced from an upstream side closer to the gas introducing opening 105 toward a downstream side further from the opening 105.

That is, if the apparatus for collectively processing the plurality of wafers 107 shown in FIG. 14 is considered from a viewpoint of gas supply with respect to each of the wafers, it seems that the gas nozzle 101 supplies gas uniformly to the wafers 107, but in reality, a difference in the gas flow rate or flow velocity is generated, and the gas is not supplied to all of the wafers 107 under the same conditions.

For example, if the five gas nozzle holes 103 provided in the gas nozzle 101 are defines as a first hole, a second hole, ... and a fifth hole from the upstream side closer to the gas introducing opening 105 of the gas nozzle 101 toward the downstream further from the opening 105, and if the flow rates of gas supplied from the respective gas nozzle holes 103 are defined as q1, q2 ... q5, a relation of $q1>q2>\ldots>q5$ is established.

Concerning the flow velocities of gas also, a velocity of gas from the first gas nozzle holes 103 is the fastest, and velocities of gas from the second, third, ... are gradually reduced.

As a result, the flow rates and flow velocities of gas supplied to the wafers 107 become nonuniform.

Therefore, in the process of wafers which largely depends of a supply amount of gas, the film forming states of the stacked wafers 107 become nonuniform.

Referring back to FIG. 14, a cause of the nonuniformity of the supply amount of gas will be considered.

In the gas nozzle 101 in a state in which gas is supplied to the wafers 107, a gas flow rate between the introducing opening 105 and the first gas nozzle hole 103 is defined as $q00$ and a gas pressure therebetween is defined as $p0$. Next, a gas flow rate between the first and second gas nozzle holes 103 is defined as $q01$ and a gas pressure therebetween is defined as $p1$. Similarly, a gas flow rate between the n−1-th and n-th gas nozzle holes 103 is defined as $q0(n-1)$ and a gas pressure therebetween is defined as $pn-1$.

A flow rate of gas injecting from the n-th gas nozzle hole 103 is defined as $qn$.

At that time, gas flow rates $qn$ (n=1, 2, ...) injecting from the plurality of gas nozzle holes 103 provided from the upstream side to the downstream side and having the same opening areas are reduced from the upstream gas nozzle hole toward the downstream gas nozzle hole as shown in the following expression (1):

$$q1>q2>\ldots>qn-1>qn \tag{1}$$

This is because, in the case of gas flowing from the upstream side toward the downstream side through the gas nozzle 101, its gas flow rate $q0(n-1)$ is reduced by a gas flow rate $qn$ injecting from the gas nozzle hole 103 when the gas passes through the gas nozzle hole 103, and the gas flows toward a next gas nozzle hole. A flow rate of gas after the gas passed through the gas nozzle hole 103 is reduced from the upstream side toward the downstream side as shown in the following expression (2):

$$q0n=q0(n-1)-qn \tag{2}$$

At that time, a gas concentration of fluid in the gas nozzle 101 is reduced by a flow rate of gas injecting from the gas holes from the upstream side toward the downstream side. Since there is a correlation between the gas concentration and gas pressure, a gas pressure $pn$ at a location in the gas nozzle 101 corresponding to the gas nozzle hole 103 is reduced from the upstream side toward the downstream side as shown in the following expression (3):

$$p1>p2>\ldots>pn-1>pn \tag{3}$$

Therefore, flow rates of gas injecting from the respective gas nozzle holes 103 do not become equal to each other. If an opening area of the gas nozzle hole 103 is defined as S, a flow velocity V of gas injecting from the gas nozzle hole is expressed as shown in the following expression (4):

$$V=qn/S \tag{4}$$

Since the flow rates of gas injected from the respective gas nozzle holes 103 are not equal to each other, if the opening areas of the nozzle holes are the same, flow velocities of gas injected from the respective gas nozzle holes 103 become different. In the above-described conventional gas nozzle 101, since the flow rates and flow velocities of gas injected from the respective gas nozzle holes 103 are different, it is considered that gas can not be supplied to the wafers uniformly.

To solve the above problem, two conventional solutions have been proposed.

According to a first solution, opening areas of the gas nozzle hole 103 are increased from the upstream side toward the downstream side, and a gas flow rate which is reduced toward the downstream side is supplemented by increasing the opening area. However, if the gas flow rates are equalized by adjusting the opening areas, the gas flow velocities are adversely varied depending upon the size of the opening area. Therefore, gas injecting from the gas nozzle holes 103 is nonuniform in the flow velocity.

According to a second solution, a capacity of the gas nozzle itself is increased to such a degree that such a large amount of gas that the injecting amount can be ignored is stored so that even if gas is injected from the gas nozzle holes 103 from the upstream side toward the downstream side, gas pressures in the gas nozzle 101 at locations corresponding to the respective gas nozzle holes 103 are not changed, thereby equalizing the flow rates of gas injecting from the gas nozzle holes 103. However, if the capacity of the gas nozzle itself is increased to such a size that the gas pressure in the gas nozzle 101 is not affected by the gas injecting amount, since there is limitation in space of the reaction chamber which accommodates the gas nozzle, this is not practical.

The above problem is not limited to a wafer, and a substrate in general also has the same problem.

SUMMARY OF THE INVENTION

Thereupon, it is a main object of the present invention to provide, from a viewpoint different from the above structure, a substrate processing apparatus capable of achieving the uniformity of process between substrates by uniformly supplying gas.

According to a first aspect of the present invention, there is provided a substrate processing apparatus, comprising:
a reaction chamber which is to accommodate stacked substrates,
a gas introducing portion, and
a buffer chamber, wherein
the gas introducing portion is provided along a stacking direction of the substrates, and introduces substrate processing gas into the buffer chamber,
the buffer chamber includes a plurality of gas-supply openings provided along the stacking direction of the substrates, and the processing gas introduced from the gas introducing portion is supplied from the gas-supply openings to the reaction chamber.

According to a second aspect of the present invention, there is provided a substrate processing apparatus, comprising:
a reaction chamber which is to accommodate stacked substrates,
a plurality of buffer chambers, and
a plurality of gas introducing portions for respectively introducing substrate processing gases to the buffer chambers, wherein
the buffer chambers respectively include a plurality of gas-supply openings provided in a stacking direction of the substrates, and the substrate processing gas introduced from each of the gas introducing portions is supplied to the reaction chamber from the gas-supply openings of each of the buffer chambers.

According to a third aspect of the present invention, there is provided a reaction container, comprising:
a reaction chamber which is to accommodate stacked substrates,
a plurality of buffer chambers, and
a plurality of gas introducing portions for respectively introducing substrate processing gases to the buffer chambers, wherein
the buffer chambers respectively include a plurality of gas-supply openings provided in a stacking direction of the substrates, and the substrate processing gas introduced from each of the gas introducing portions is supplied to the reaction chamber from the gas-supply openings of each of the buffer chambers.

According to a forth aspect of the present invention, there is provided a reaction container, comprising:
a reaction chamber which is to accommodate stacked substrates,
a gas introducing portion, and
a buffer chamber, wherein
the gas introducing portion is provided along a stacking direction of the substrates, and introduces substrate processing gas into the buffer chamber,
the buffer chamber includes a plurality of gas-supply openings provided along the stacking direction of the substrates, and the processing gas introduced from the gas introducing portion is supplied from the gas-supply openings to the reaction chamber.

BRIEF DESCRIPTION OF THE DRAWINGS

The above and further objects, features and advantages of the present invention will become more apparent from the following detailed description taken in conjunction with the accompanying drawings, wherein:

FIG. 1 is a schematic sectional view of a inside of a reaction tube of a substrate processing apparatus according to a first embodiment of the present invention;

FIG. 5A is a view showing an outward appearance of a reaction tube of a substrate processing apparatus according to a second embodiment of the present invention;

FIG. 5B is a schematic longitudinal sectional view of a reaction tube of a substrate processing apparatus according to a second embodiment of the present invention;

FIG. 5C is a schematic longitudinal partial sectional view of a reaction tube of a substrate processing apparatus according to a second embodiment of the present invention;

DESCRIPTION OF THE PREFERRED EMBODIMENTS

Figure 2A:
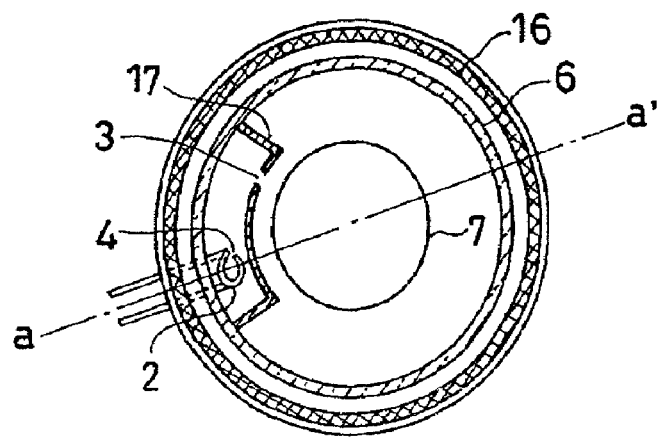
FIG. 2A is a schematic lateral sectional view of a reaction tube of a substrate processing apparatus according to a first embodiment of the present invention.

According to a preferred embodiment of the present invention, there is provided a substrate processing apparatus comprises a reaction chamber which is to accommodate stacked substrates, a gas introducing portion, and a buffer chamber, wherein the gas introducing portion is provided along a stacking direction of the substrates, and introduces substrate processing gas into the buffer chamber, the buffer chamber includes a plurality of gas-supply openings provided along the stacking direction of the substrates, and the processing gas introduced from the gas introducing portion is supplied from the gas-supply openings to the reaction chamber.

With this structure, the substrate processing apparatus according to the present invention, nonuniform flow velocity of gas supplied from the gas introducing portion can be equalized in the buffer chamber, and gas can be supplied to the stacked substrates uniformly.

Preferably, opening areas of the gas-supply openings provided in the buffer chamber are substantially equal to each other.

It is possible to further equalize the gas supply to the substrates by providing the gas-supply openings having the same opening areas.

Preferably, the buffer chamber is provided therein with electrodes for generating plasma.

Since the electrodes for generating plasma are provided in the buffer chamber, active species are produced by plasma at a location close to the substrates and in a state in which pressure is uniform, and uniform and more active species can be supplied to the substrates.

Next, embodiments of the present invention will be explained with reference to the drawings.

First, as an example of process for a substrate carried out in the embodiment of the invention, film forming processing using the CVD method and the ALD method will briefly be explained based on a comparison the methods.

In the CVD method, one kind (or more kinds) of gases which are raw material used for forming a film are mixed and supplied onto a substrate under a certain film forming condition (temperature, time or the like), the gas is adsorbed and reacted on the substrate using both vapor-phase reaction and surface reaction, or only surface reaction, thereby forming a film.

According to the ALD method, two kinds (or more kinds) of gases which are raw material used for forming a film are alternately supplied onto a substrate one kind gas by one kind gas under a certain film forming condition (temperature, time or the like), the gas is adsorbed in one atomic layer unit, and a film is formed utilizing the surface reaction.

That is, when a SiN (silicon nitride) film is to be formed for example, in the case of the ALD method, DCS (dichlorsilane) and $NH_3$ (ammonia) are used for carrying out chemical reaction to be utilized, and a film having high quality can be formed at a low temperature of 300 to 600° C. Whereas, in the case of a normal CVD method, a film forming temperature is relatively high as high as 600 to 800° C. In the case of the ALD method, a plurality of kinds of reaction gases are alternately supplied one kind gas by one kind gas (not at the same time), and in the case of the normal CVD method, a plurality of kinds of gases are supplied at the same time. In the ALD method, a film thickness is controlled based on the number of cycles of supply of reaction gas (assuming that a film forming velocity is 1 Å/cycle for example, when a film of 20 Å is to be formed, the processing is carried out through 20 cycles), and in the CVD method, a film thickness is controlled based on time.

An embodiment of the present invention will be explained with reference to FIGS. 1 to 13.

The same elements are designated with the same symbols in FIGS. 1 to 13.

Figure 4:
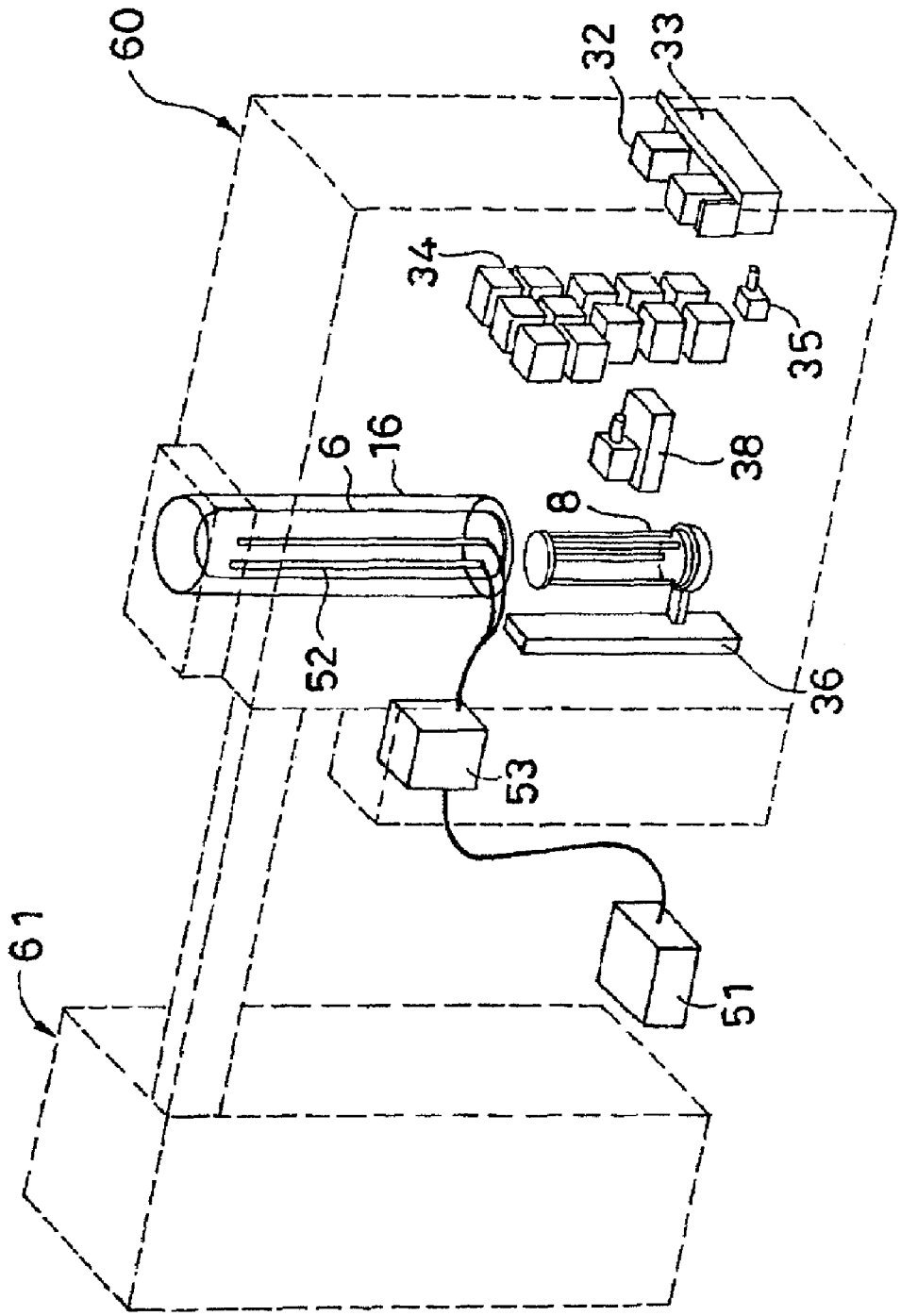
FIG. 4 is a schematic view for explaining a mechanism of a vertical type substrate processing apparatus according to embodiments of the present invention.

First, an outline of a mechanism of a vertical type substrate processing apparatus of each of embodiments of the present invention will be briefly explained using FIG. 4.

FIG. 4 shows an outward appearance of an example of a vertical type substrate processing apparatus in which a plurality of wafers which are substrates to be processed and which have diameter of 200 mm are loaded in a reaction tube which is a reaction chamber and made of quartz, and films are formed by the CVD method or the ALD method which is one of the CVD method as processing method.

The vertical type substrate processing apparatus has a body 60 and a utility portion 61 which supplies electric power or the like to the body 60.

In the body 60, there are provided a reaction tube 6 as a vertical type reaction chamber for processing wafers, and a heater 16 for appropriately heating the reaction tube 6. A boat 8 for loading and unloading the wafers into and from the reaction tube 6, and a boat elevator 36 for vertically moving the boat 8 are disposed below the reaction tube 6.

If it is necessary to produce plasma in the reaction tube 6, electrodes 52 are provided in the reaction tube 6, high frequency electric power is applied to the electrodes 52 from a high frequency power supply 51 through an RF matching unit 53.

Further, provided in the body 60 are cassette shelves 34 for temporarily storing cassettes in which wafers to be supplied to the boat 8 are accommodated, and a wafer transfer apparatus 38 for supplying wafers which are not yet processed (pre-process wafers, hereinafter) from the cassette shelves 34 to the boat 8 and for transferring out wafers which were processed (post-process wafers, hereinafter).

A cassette loader 35 transfers a cassette 32 between the cassette shelves 34 and an I/O stage 33 which receives and delivers the cassette 32 of the wafer from and to outside.

The I/O stage 33 is disposed on a front surface of the apparatus, and delivers and receives the cassette 32 accommodating wafers to and from outside.

The operation of the above-described vertical type substrate processing apparatus will be explained briefly.

The cassettes 32 accommodating the wafers are set to the I/O stage 33.

The cassettes 32 set in the I/O stage 33 are transferred to the cassette shelves 34 by the cassette loader 35 in succession.

In the cassette 32, 25 wafers are accommodated.

The wafer transfer apparatus 38 transfers the wafers out from the cassette shelves 34 and transfers the same to the quartz boat 8. Since 100 wafers can be loaded into the boat 8, the transfer operation by the wafer transfer apparatus 38 is repeated several times.

If the transfer operation of the wafers to the boat 8 is completed, the boat 8 is moved upward by the boat elevator 36 and inserted into the reaction tube 6 and then, the inside of the reaction tube 6 is held air-tightly.

The gas is exhausted from the reaction tube 6 through an exhaust opening (not shown) using a pump, and if a pressure in the reaction tube 6 reaches a predetermined value, the boat 8 is rotated by a rotating mechanism (not shown), and film-forming processing gas of a certain flow rate is supplied into the reaction tube 6. A pressure of the supplied processing gas is maintained at a constant value by a pressure adjusting mechanism (not shown). At that time, the wafers in the reaction tube 6 are maintained at a predetermined temperature.

The process for forming films on the wafers is proceeded in this manner, and further details thereof will be described later.

If the film is formed by a plasma CVD method or the ALD method, high frequency electric power is applied to the electrodes 52 from the high frequency power supply 51 through the RF matching unit 53, plasma is produced in the film-forming gas, and the film-forming gas is activated. This activating operation will also be described later.

If the process for forming film is completed, the wafer boat 8 is moved down from the reaction tube 6 by the boat elevator 36, the wafer boat 8 is transferred to the I/O stage 33 through the wafer transfer apparatus 38, the cassette shelves 34 and the cassette loader 35, and transferred out from the apparatus.

Next, embodiments using the above-described vertical type substrate processing apparatus will be explained.

First Embodiment

Embodiment Using CVD Method for Film Forming Process

Figure 2B:
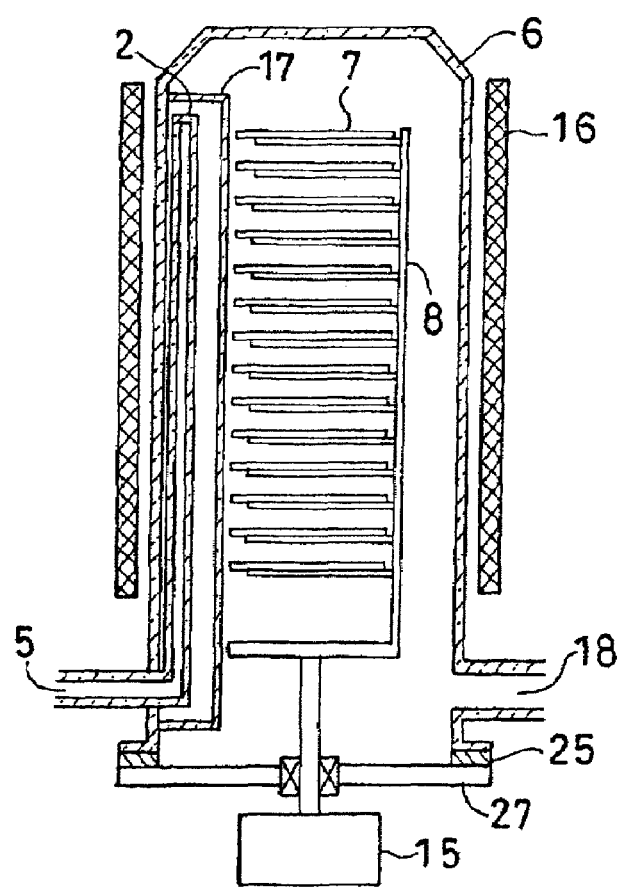
FIG. 2B is a longitudinal sectional view taken along a line aa' of FIG. 2A.

FIG. 2A is a schematic lateral sectional view of the reaction tube in the vertical type substrate processing apparatus according to this embodiment, and FIG. 2B is a vertical sectional view taken along a line a-a' in FIG. 2A.

In FIG. 2A, a heater 16 is provided on an outer periphery of the reaction tube 6 which is a vertical type reaction chamber. A plurality of wafers 7 as substrates to be processed are stacked and placed in the reaction tube 6. In an arc space between the wafers 7 and an inner wall of the reaction tube 6, a buffer chamber 17 is provided on an inner wall of the reaction tube 6 from its lower portion to its upper portion along a stacking direction of the wafers 7. Buffer chamber holes 3 as gas-supply openings are provided in an end of a wall of the buffer chamber 17 which is adjacent to the wafer 7. The buffer chamber holes 3 are opened toward a center of the reaction tube 6.

An end of the buffer chamber 17 which is opposite from the buffer chamber holes 3 is provided with a gas nozzle 2 formed in the gas introducing portion from the lower portion to the upper portion of the reaction tube 6 along the stacking direction of the wafers 7. The gas nozzle 2 is provided with a plurality of gas nozzle holes 4.

As shown in FIG. 2B, an outer periphery of the reaction tube 6 is covered with the heater 16. The reaction tube 6 is supported on a furnace opening flange 25. A furnace opening of the furnace opening flange 25 is air-tightly closed with a furnace opening cap 27.

The boat 8 is provided in a central portion in the reaction tube 6. The plurality of wafers 7 are placed in the boat 8 at equal distances from one another in a multistage manner. The boat 8 can come into and go out from the reaction tube 6 by the boat elevator. In order to enhancing the uniformity of the processing, the boat 8 is provided at its lower portion with a rotating mechanism 15 for rotating the boat 8.

When the boat 8 enters the reaction tube 6 to form films on the wafers 7, the wafers 7 placed in the multistage manner are placed at an equal distance from the buffer chamber 17.

The buffer chamber 17 is provided along the inner wall of the reaction tube 6, the gas nozzle 2 is disposed in the buffer chamber 17 from the lower portion to the upper portion of a side surface of the reaction tube 6, and a portion of the gas nozzle 2 at the lower portion becomes a gas introducing opening 5.

The gas nozzle 2 and the buffer chamber 17 are provided with the gas nozzle holes and the buffer chamber holes, respectively. Examples of opening states of these holes will be explained using FIGS. 3A and 3B.

Figure 3A:
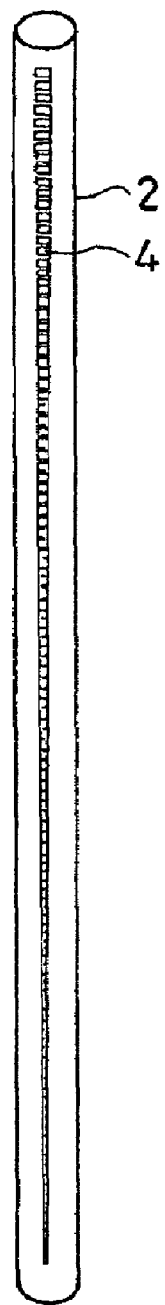
FIG. 3A is a perspective view of a gas nozzle according to a first embodiment of the present invention.
Figure 3B:
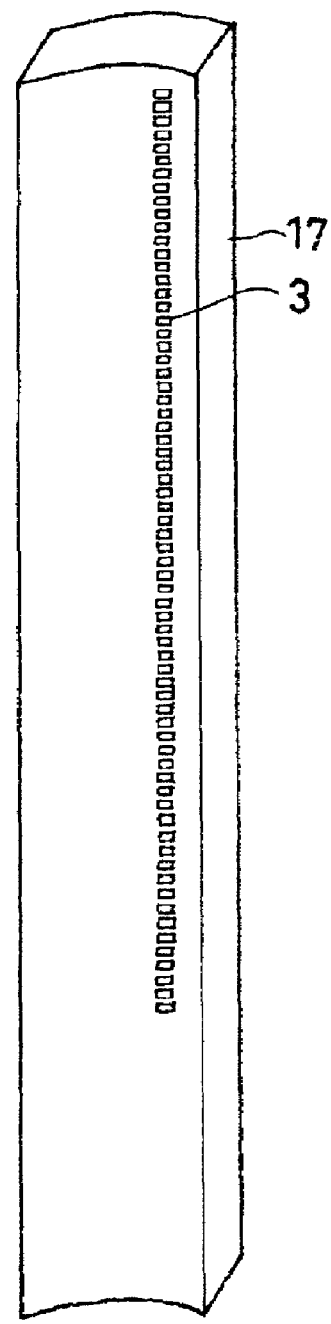
FIG. 3B is a perspective view of a buffer chamber according to a first embodiment of the present invention.

FIG. 3A is a perspective view of the gas nozzle shown in FIGS. 2A and 2B. FIG. 3B is a perspective view of the buffer chamber also shown in FIGS. 2A and 2B.

The gas nozzle 2 shown in FIG. 3A is a pipe having a circular cross section. The gas nozzle holes 4 are straightly arranged in a side surface of the gas nozzle 2 from its substantially uppermost portion to a bottom of the buffer chamber 17 from an upstream side toward a downstream side of gas flow. Opening areas of the gas nozzle holes 4 are increased from the upstream side (lower portion in FIG. 3A) toward the downstream side (upper portion in FIG. 3A) as viewed from the gas introducing opening.

The buffer chamber 17 shown in FIG. 3B is a pipe having an arc cross section. The buffer chamber holes 3 having the same opening areas are straightly arranged in an end of a curve inner surface of the buffer chamber 17 along the stacking direction of the wafers 7.

Referring back to FIG. 2B, the reaction tube 6 is provided at its lower portion with an exhaust opening 18 connected to an exhaust pump (not shown).

The film forming process by the CVD method on the wafer 7 in the reaction tube 6 will be explained with reference to FIGS. 2A and 2B.

The processing gas which is raw material is supplied to the gas nozzle 2 from the gas introducing opening 5. The gas nozzle 2 is provided with the plurality of gas nozzle holes 4, and the gas nozzle 2 injects gas into the buffer chamber 17. As described as the conventional solution, however, it is difficult to uniform the flow rate and the flow velocity of gas injected from the plurality of gas nozzle holes 4 by controlling only the opening areas of the gas nozzle holes 4.

Thereupon, in the present invention, the opening areas of the gas nozzle holes 4 are increased from the upstream side toward the downstream side. With this arrangement, gas of substantially the same flow rate is injected from each of the gas nozzle holes 4 although there is a difference in the flow velocity of gas. Then, the gas injected from the gas nozzle holes 4 is not injected into the reaction tube 6, but the gas once injected and introduced into the buffer chamber 17, and the flow velocities of the gas are uniformed.

That is, the gas injected from each the gas nozzle holes 4 in the buffer chamber 17 is moderated in the particle velocity of gas in the buffer chamber 17 and then, is injected into the reaction tube 6 from the buffer chamber holes 3. During that time, kinetic energies of the gas injected from the gas nozzle holes 4 are exchanged and thus, when the gas is injected from the buffer chamber holes 3, gas having the uniform flow rate and flow velocity can be injected.

The equalizing operation of the gas supply amount in the buffer chamber 17 will be explained in more detail using FIG. 1.

FIG. 1 is a schematic sectional view showing a relation between the gas nozzle, the buffer chamber and the reaction tube in the reaction tube of the vertical type substrate processing apparatus of the invention.

In FIG. 1, the buffer chamber 17 is provided in the reaction tube 6. The gas nozzle 2 is disposed in the buffer chamber 17, and the reaction tube 6 is provided with the exhaust opening 18 for exhausting gas in the reaction tube 6 to outside.

In the reaction tube 6, the boat 8 having wafers 7 (five wafers in FIG. 1) is provided adjacent to the buffer chamber 17.

The gas nozzle 2 and the buffer chamber 17 are respectively provided with the gas nozzle holes 4 and the buffer chamber holes 3 (five each in FIG. 1). The opening areas of the gas nozzle holes 4 are increased from the upstream side toward the downstream side as viewed from the gas introducing opening 5 so that the injecting amounts of gas from the gas nozzle holes 4 become the same.

With this structure, if the gas nozzle holes 4 of the gas nozzle 2 are respectively defined as the first, second . . . fifth gas nozzle hole from the upstream side closer to the introducing opening 5 toward the downstream side further from the introducing opening 5, and if the flow rates of gas supplied from the respective gas nozzle holes 4 are respectively defined as Q1, Q2 . . . Q5, it is possible to obtain a state of Q1=Q2= . . . =Q5.

In the flow velocities of gas as explained in the conventional solution, however, gas from the first gas nozzle hole 4 is the fastest, and the flow velocity is gradually reduced in the order of the second, third, forth and fifth gas nozzle holes.

Gas having the same flow rates but different flow velocities Q1 to Q5 is once introduced into the buffer chamber 17. During that time, gas having the flow velocities Q1 to Q5 is uniformed in flow velocity by exchanging kinetic energies, and a pressure in the buffer chamber 17 is substantially equalized.

As a result, if the flow rates of gas injected from the buffer chamber holes 3 are respectively defined as R1, R2 . . . R5, even if the buffer chamber holes 3 have the same opening areas, since the pressure in the buffer chamber 17 is uniform, a state of R1=R2= . . . =R5 can be obtained, and the flow velocities become equal to each other.

Further, the opening positions of the buffer chamber holes 3 have the same pitches as the wafers 7 which are respectively adjacent to the buffer chamber holes 3, and the gas is supplied to gaps between the wafers 7. Therefore, gas having uniform flow velocities and flow rates can efficiently be supplied to the wafers 7 preferably.

Since the gas having uniform flow velocities and flow rates can efficiently be supplied to the wafers 7, the film forming states of the wafers 7 are equalized, and the processing speed of the wafers 7 can largely be enhanced.

Although the gas nozzle and the buffer chamber are described in the above explanation based on the CVD method, the invention can also be applied based on the ALD method also.

Second Embodiment

Embodiment Using ALD Method for Film Forming Process

An embodiment for forming films by the ALD method will be explained concretely.

When films are formed on the wafers 7 by the ALD method also, the above-described vertical type substrate processing apparatus can be used. In the case of the ALD method, however, if it is required to activate the processing gas by plasma or the like, an apparatus and an operation required for this process are added.

A case for forming films by the ALD method will be explained below using FIGS. 5A, 5B and 5C and FIG. 6.

Figure 6:
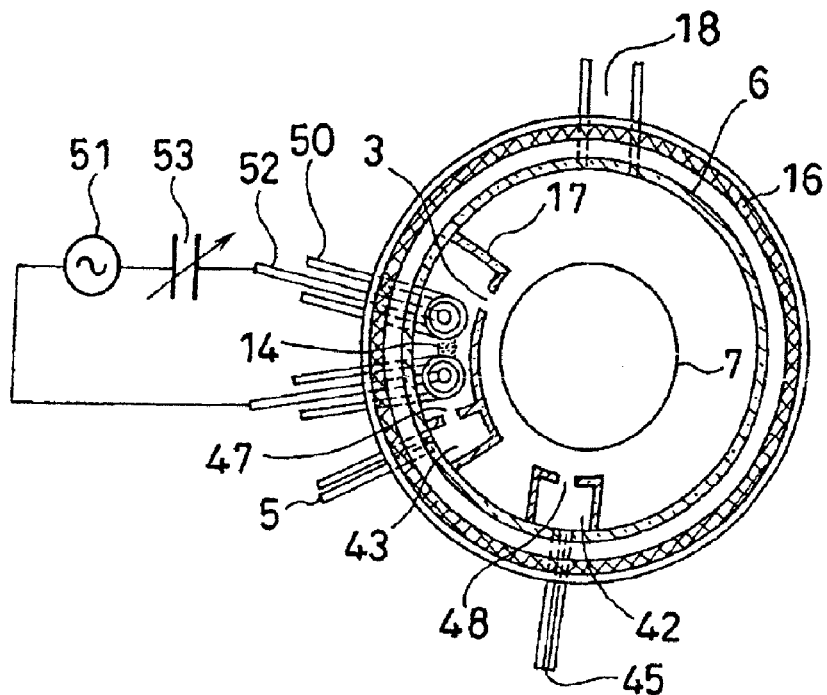
FIG. 6 is a lateral sectional view taken along a line A-A of FIG. 5A.

FIGS. 5A, 5B and 5C show, from a side, an outward appearance and the inside of the reaction tube which is the reaction chamber in the vertical type substrate processing apparatus of the invention used for forming films by the ALD method. FIG. 6 is a lateral sectional view taken along a line A-A.

FIG. 5A shows the outward appearance of the reaction chamber. FIGS. 5B and C are vertical sectional views of the reaction chamber. In the drawings, connected portions of the furnace opening flange with respect to the heater, the wafers, the boat and the reaction tube, as well as the boat rotating mechanism are omitted.

In FIG. 6, the reaction tube 6 is provided at its outer periphery with a heater 16, and the plurality of wafers 7 as substrates to be processed are stacked inside the reaction tube 6. The buffer chamber 17 is provided in the arc space between the wafers 7 and the inner wall of the reaction tube 6 along the stacking direction of the wafers 7 to the inner wall of the reaction tube 6, and the buffer chamber holes 3 are provided in the end of the wall which is adjacent to the wafers.

The reaction tube 6 is provided at its lower portion with the exhaust opening 18.

In the reaction tube explained in FIG. 2A, the gas nozzle is provided in the end which is opposite from the buffer chamber hole in the buffer chamber. In this embodiment, a gas supply chamber 43 is provided as the gas introducing portion in the reaction tube instead of the gas nozzle. The gas supply chamber 43 is provided at its lower portion with the gas introducing opening 5.

A partition wall between the gas supply chamber 43 and the buffer chamber 17 is provided with gas supply chamber holes 47 having the same structure as that of the gas nozzle holes provided in the above-described gas nozzle. The opening positions of the buffer chamber holes 3 provided in the buffer chamber 17 have the same pitches as those of the adjacent wafers 7.

As a result, like the first embodiment, gas is once introduced from the gas introducing portion, and gas can be supplied to the stacked wafers 7 uniformly.

In this embodiment, the electrode 52 is disposed in the buffer chamber 17 such that the electrode 52 is protected by an electrode-protecting tube 50 from its upper portion to lower portion. The electrode 52 is connected to the high frequency power supply 51 through the RF matching unit 53. As a result, the electrode 52 can generate plasma 14 in the buffer chamber 17.

In addition, in this embodiment, a reaction gas buffer chamber 42 is provided on an inner wall of the reaction tube 6 at a location away from the opening of the buffer chamber hole 3 through 120° along the inner periphery of the reaction tube 6. This reaction gas buffer chamber 42 contains gas different from that contained in the buffer chamber 17. When the films are to be formed by the ALD method, the reaction gas buffer chamber 42 and the buffer chamber 17 supply different kinds of gases to the wafers 7 alternately.

Like the buffer chamber 17, the reaction gas buffer chamber 42 has reaction gas buffer chamber holes 48 with the same pitches at locations adjacent to the wafers. The reaction gas buffer chamber 42 is provided at its lower portion with a reaction gas introducing opening 45. Unlike the buffer chamber 17, the reaction gas buffer chamber 42 does not have the gas supply chamber 43 and the electrode 52. Opening areas of the reaction gas buffer chamber holes 48 are increased from the upstream side toward the downstream side.

The reaction tube 6 is provided at its lower portion with the exhaust opening 18. When different kinds of gases are alternately supplied to the wafers 7 to form films by the ALD method, the exhaust opening 18 can exhaust inside gas from the reaction tube 6.

FIG. 5A shows an outward appearance and the inside (shown with broken lines) of the reaction tube 6 as viewed from a front surface of the buffer chamber 17.

The buffer chamber 17 is provided in the reaction tube 6 such as to extend from its upper portion to lower portion. The gas supply chamber 43 is provided adjacent to the buffer chamber 17. The electrode 52 covered with the electrode-protecting tube 50 is disposed in the buffer chamber 17 from its upper portion to lower portion. The gas supply chamber 43 is provided at its lower portion with the gas introducing opening 5.

This electrode-protecting tube 50 can be inserted into the buffer chamber 17 in a state in which the thin and long electrode 52 is isolated from atmosphere in the buffer chamber 17. Here, since the inside has the same atmosphere as outside air, the electrode 52 inserted into the electrode-protecting tube 50 is oxidized by heat from the heater. Therefore, an inert gas purging mechanism is provided in the electrode-protecting tube 50 for charging or purging inert gas such as nitrogen to suppress the oxygen concentration to sufficiently low level.

The reaction gas buffer chamber 42 is provided in the reaction tube 6 along its inner wall from its upper portion to lower portion away from the buffer chamber 17. The reaction gas buffer chamber 42 is provided at its lower portion with the reaction gas introducing opening 45.

The reaction tube 6 is provided at its lower portion with the exhaust opening 18 along the inner wall of the reaction tube 6 at a location opposed from the reaction gas buffer chamber 42 with respect to the buffer chamber 17.

FIG. 5B shows the inside of the reaction tube 6 as viewed from front surfaces of the buffer chamber holes 3 and the reaction gas buffer chamber holes 48.

In the reaction tube 6, the buffer chamber 17 and the gas supply chamber 43 adjacent to the buffer chamber 17 extend from the upper portion to the lower portion in the reaction tube 6. The buffer chamber holes 3 having the same pitches are provided at positions adjacent to the wafers (not shown) from the upper portion to the lower portion in the buffer chamber 17. The buffer chamber holes 3 have the same opening areas in the wall of the buffer chamber 17 having the same thickness.

The reaction gas buffer chamber 42 is provided in the reaction tube 6 along its inner wall from its upper portion to lower portion away from the buffer chamber 17. The reaction gas buffer chamber holes 48 having the same pitches are provided adjacent to the wafers (not shown) from the upper portion to the lower portion in the reaction gas buffer chamber 42. The opening areas of the reaction gas buffer chamber holes 48 are increased from the upstream side toward the downstream side, from the lower portion to the upper portion in FIGS. 5A, 5B and 5C.

FIG. 5C is a vertical sectional view of the reaction tube 6 as viewed from front surfaces of the gas supply chamber holes 47 provided in the gas supply chamber 43.

The gas supply chamber 43 is provided in the reaction tube 6 from the upper portion to the lower portion adjacent to the buffer chamber 17. A partition wall between the buffer chamber 17 and the gas supply chamber 43 is provided with the gas supply chamber holes 47 from the upper portion to a location lower than the lower portion where the gas supply chamber holes 47 are adjacent to the wafers (not shown). The reason why the gas supply chamber holes 47 are opened up to the lowermost end of the buffer chamber 17 is that stagnation of gas is not generated in the buffer chamber 17.

Like the gas nozzle holes provided in the gas nozzle explained in FIG. 3A, the opening areas of the gas supply chamber holes 47 are increased from the upstream side toward the downstream side of the gas flow.

Here, the film forming operation on the wafers 7 in the reaction tube 6 by the ALD method will be explained with reference to FIGS. 5A, 5B, 5C and 6.

In this film forming example, active species of ammonia ($NH_3$) and dichlorsilane ($SiH_2Cl_2$) are alternately supplied as processing gas, and SiNx film (silicon nitride film) is formed by an atomic layer film-forming method.

First, 100 wafers 7 are loaded into the reaction tube 6, and the inside of the reaction tube 6 is brought into the air-tight state and maintained in this state. The reaction tube 6 is exhausted by a pump (not shown) through an exhaust pipe, and a temperature in the reaction tube 6 is constantly maintained in a range of 300 to 600° C. by adjusting the temperature using the heater 16.

The supply of ammonia to the gas supply chamber 43 from the gas introducing opening 5 is started.

The opening areas of the gas supply chamber holes 47 provided in the gas supply chamber 43 are gradually increased from the upstream side toward the downstream side of the gas flow so that the flow rates of ammonia injected into the buffer chamber 17 from the gas supply chamber 43 become the same.

Therefore, the flow velocity of ammonia injected into the buffer chamber 17 through the gas supply chamber holes 47 is fast at the upstream side and slow at the downstream side, but the flow rates of the ammonia through all of the gas supply chamber holes 47 are the same.

The ammonia injected to the buffer chamber 17 once stay therein, kinetic energies are exchanged, the flow velocities are equalized and the pressure in the buffer chamber 17 becomes uniform.

In a state in which the ammonia is introduced into the buffer chamber 17 and a pressure in the space between the pair of electrode-protecting tubes becomes uniform, high frequency electric power from the high frequency power supply 51 is supplied to the rod-like electrodes 52 inserted into the two electrode-protecting tubes 50 through the RF matching unit 53, plasma 14 is produced between the electrode-protecting tubes 50.

By bringing the ammonia into plasma state in the buffer chamber 17, active species of ammonia is produced. At that time, since the plasma is produced in a state in which the pressure in the buffer chamber 17 is uniform, an electron temperature and plasma concentration distribution which affect the production of active species also become uniform. Therefore, more uniform active species can be produced.

The active species produced by the effect of plasma has lifetime, and if a distance between a plasma producing portion and the wafer 7 is long, the species are deactivated before they are supplied to the wafers 7, and an amount of active species which contribute to the reaction on the wafers 7 is largely reduced. Therefore, it is preferable that the plasma is produced in the vicinity of the wafers 7.

According to this structure, since the active species of ammonia is produced in the buffer chamber 17 which is in the vicinity of the wafers 7, it is possible to efficiently supply a large amount of active species of produced ammonia to the wafers 7.

It is preferable that the distance between the two electrode-protecting tubes 50 is set to an appropriate value so that a place where the plasma 14 is generated is limited to inside the buffer chamber 17, and a preferable distance is about 20 mm. The plasma 14 may be produced anywhere inside the buffer chamber 17, and it is preferable that the gas introduced into the buffer chamber 17 passes through the plasma. Preferably, the plasma 14 is produced between the buffer chamber hole 3 and the gas supply chamber hole 47.

A distance between the electrode-protecting tube 50 and the buffer chamber hole 3 is adjusted to an appropriate value so that the plasma 14 generated in the buffer chamber 17 is not dispersed and leaked outside the buffer chamber 17.

As a result, only electrically neutral active species of ammonia are supplied from the buffer chamber holes 3 to the wafers 7, and it is possible to avoid the damage caused by charge-up of the wafer 7.

Since all the buffer chamber holes 3 provided in the buffer chamber 17 have the same opening areas, the active species supplied to the wafers 7 have uniform flow rates and flow velocities and thus, uniform film forming processing is carried out for the wafers 7.

Since the buffer chamber holes 3 are located at intermediate portions of the gap between the adjacent wafers 7 placed in the multistage manner, the processing gas is sufficiently supplied to the stacked wafers 7.

In the ALD method in which different kinds of processing gases are alternately supplied to form extremely thin films by one layer by one layer, if one layer of the extremely thin film including N atom is formed by supply of the active species of ammonia, the thickness is limited by appropriately setting a pressure or a temperature inside the reaction tube 6, and the thickness of the film is not further increased.

If the extremely thin film including the N atom is formed on the entire surface of the wafer 7, the supply of RF electric power applied to the electrode 52 is cut off, and the supply of ammonia is stopped.

Next, the inside of the reaction tube 6 is purged by inert gas such as $N_2$ or Ar and in this state, the gas is exhausted from the exhaust opening 18. If the concentration of the active species of ammonia in the reaction tube 6 has sufficiently reduced, the supply of the inert gas is stopped, and dichlorsilane is introduced into the reaction gas buffer chamber 42 from the reaction gas introducing opening 45.

The reaction gas buffer chamber holes 48 whose opening areas are gradually increased from the upstream side toward the downstream side of the reaction gas introducing opening 45 are provided in the reaction gas buffer chamber 42 toward the center of the reaction tube 6. As a result, the dichlorsilane supplied to the wafers from the reaction gas buffer chamber holes 48 has different flow velocities but has the same flow rates and is injected into the reaction tube 6.

If another set of gas supply chamber 43 and buffer chamber 17 which is adjacent to the gas supply chamber 43 which are same as those used for supplying ammonia are disposed in the reaction tube 6 instead of the reaction gas buffer chamber 42, and dichlorsilane is supplied from the buffer chamber holes 3, it is preferable because the flow rater and flow velocities become uniform.

In this embodiment, if the flow rates of dichlorsilane is equalized using the reaction gas buffer chamber 42 which is more simple than the combination of the gas supply chamber 43 and the buffer chamber 17, it is possible to form sufficiently uniform films on the wafers 7.

If particles including Si is adsorbed on the wafer 7 in the extremely thin film form, the supply of the dichlorsilane is stopped. Then, the inside of the reaction tube 6 is purged by inert gas such as $N_2$ or Ar, the gas is exhausted from the exhaust opening 18 and when the concentration of dichlorsilane in the reaction tube 6 is reduced sufficiently, the supply of the inert gas is stopped.

A SiNx film of about 1 Å is formed through this series of process. When a SiNx film of 500 Å is to be formed on a wafer 7, the above process is repeated about 500 times.

If the boat (not shown) in which the wafers 7 are placed is rotated at a constant speed, even if gas is supplied from a side of the wafers 7, more uniform film forming processing is realized over the entire surfaces of the wafers 7. In this embodiment, the rotating speed of 1 to 10 rpm is sufficient.

When the boat was not rotated, uniformity of film thickness of the wafer 7 is about ±5%, but when the boat was rotated, the uniformity was <±1%.

Third to Fifth Embodiments

Different Embodiments Using ALD Method for Film Forming Process

Figure 7:
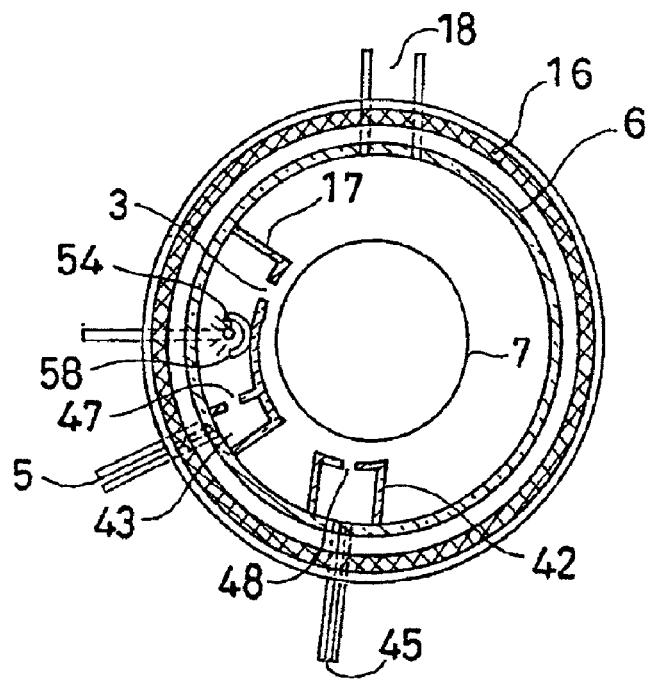
FIG. 7 is a lateral sectional view of a reaction tube of a substrate processing apparatus according to a third embodiment of the present invention.

FIG. 7 is a lateral sectional view of a reaction tube of a vertical type substrate processing apparatus according to a third embodiment of the present invention.

The reaction tube 6 shown in FIG. 7 has the same structure as that shown in FIG. 6. In FIG. 6, the electrode for producing plasma is disposed in the buffer chamber 17. In FIG. 7, an ultraviolet lamp 54 for activating gas and a reflection plate 58 for preventing ultraviolet from radiating out from the buffer chamber 17 are provided in combination.

Reaction gas is activated by light energy of the lamp 54.

The processing gas which is brought into the active species in the buffer chamber 17 having the above structure is injected toward the wafers 7 from the buffer chamber holes 3, and films are formed on the wafers 7 by the ALD method.

Figure 8:
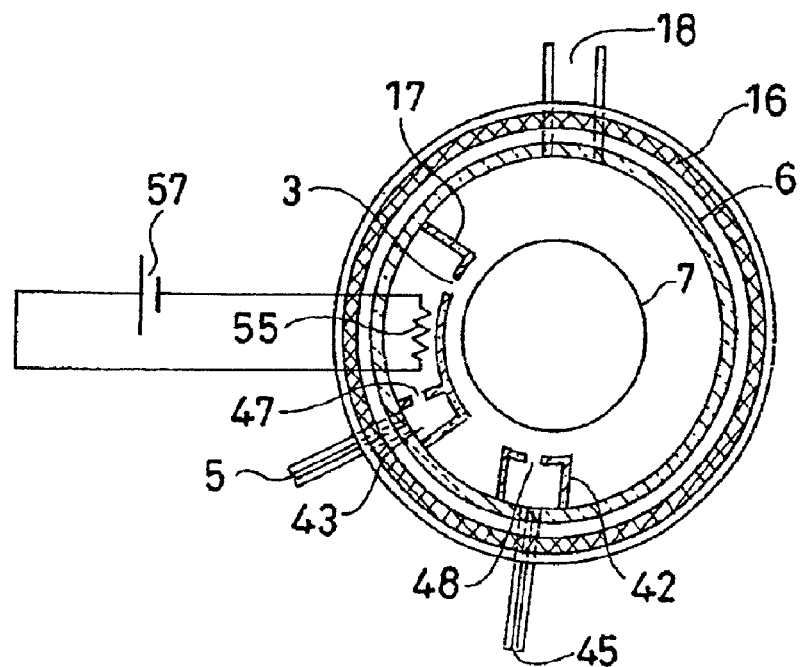
FIG. 8 is a lateral sectional view of a reaction tube of a substrate processing apparatus according to a forth embodiment of the present invention.

FIG. 8 is a lateral sectional view of a reaction tube of a vertical type substrate processing apparatus according to a fourth embodiment of the invention.

The reaction tube 6 shown in FIG. 8 has the same structure as that shown in FIG. 7. In FIG. 7, the reaction gas is activated by light energy. In the fourth embodiment, an exotherm (hot wire, hereinafter) 55 having appropriate electrical resistance value is heated by a power supply 57 to a temperature of 1,600° C. or higher, and gas which comes into contact with the hot wire is activated.

As the hot wire 55 having the appropriate electrical resistance value and generating the active species, a W (tungsten) wire having about 0.5 mm or the like can be suitably used.

This hot wire 55 is heated to 1,600° C. or higher by electric power of the power supply 57, and processing gas which comes into contact with the hot wire 55 is activated by the thermal energy.

The processing gas which is brought into the active species in the buffer chamber 17 having the above structure is injected toward the wafers 7 from the buffer chamber holes 3, and films are formed on the wafers 7 by the ALD method.

Figure 9:
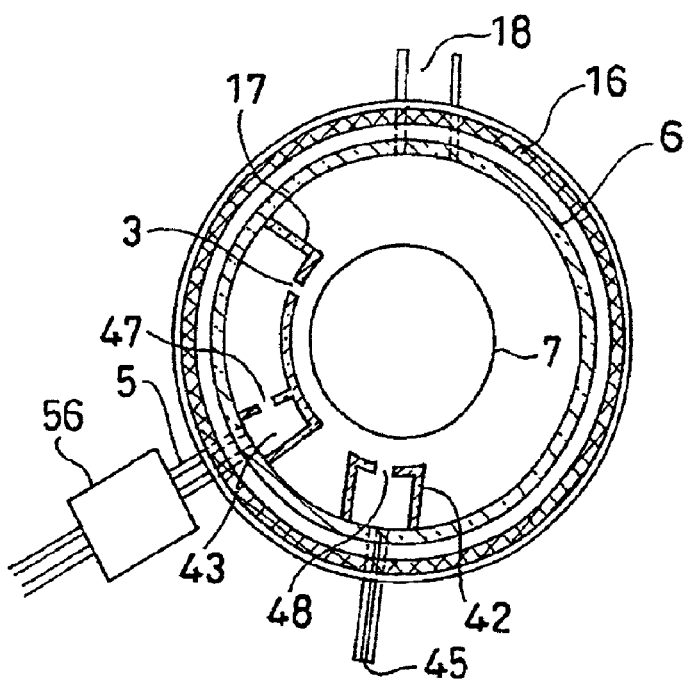
FIG. 9 is a lateral sectional view of a reaction tube of a substrate processing apparatus according to a fifth embodiment of the present invention.

FIG. 9 is a lateral sectional view of a reaction tube of a vertical type substrate processing apparatus according to a fifth embodiment of the invention.

The reaction tube 6 shown in FIG. 9 has the same structure as that shown in FIG. 6. In FIG. 6, the plasma generating electrode is disposed in the buffer chamber 17. In the fifth embodiment shown in FIG. 9, a remote plasma unit 56 is disposed on a gas passage upstream from the gas introducing opening 5 through which processing gas is introduced into the reaction tube 6, and gas passing through the remote plasma unit 56 is allow to produce plasma.

The processing gas passing through the remote plasma unit 56 is reacted with plasma and brought into active species, the gas which was brought into the active species enters the reaction tube 6 from the gas introducing opening 5, and is supplied to the buffer chamber 17 through the gas supply chamber 43, and is further supplied to the wafers 7 as uniform gas from the buffer chamber holes 3 provided in the buffer chamber 17. Then, films are formed on the wafers 7 by the ALD method.

An ICP coil or the like is suitably used as the remote plasma unit 56.

According to this structure, an amount of active species to be supplied to the wafers is reduced and processing efficiency is deteriorated as compared with the apparatus shown in FIG. 6. This fifth embodiment is used for a case in which the deterioration in the processing efficiency makes no problem.

Sixth to Eighth Embodiments

Figure 10:
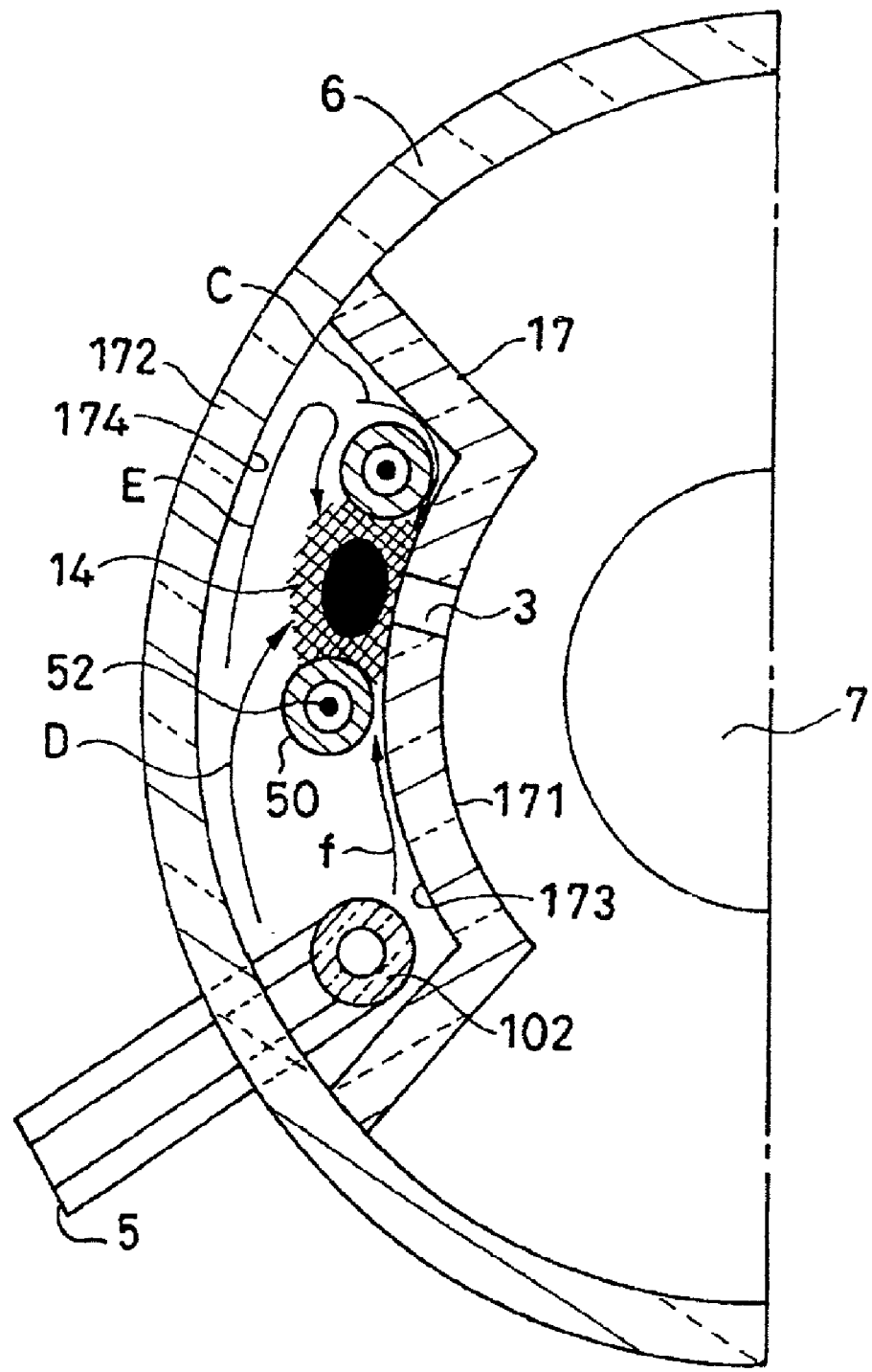
FIG. 10 is a lateral partial sectional view of a reaction tube of a substrate processing apparatus according to a sixth embodiment of the present invention.
Figure 11:
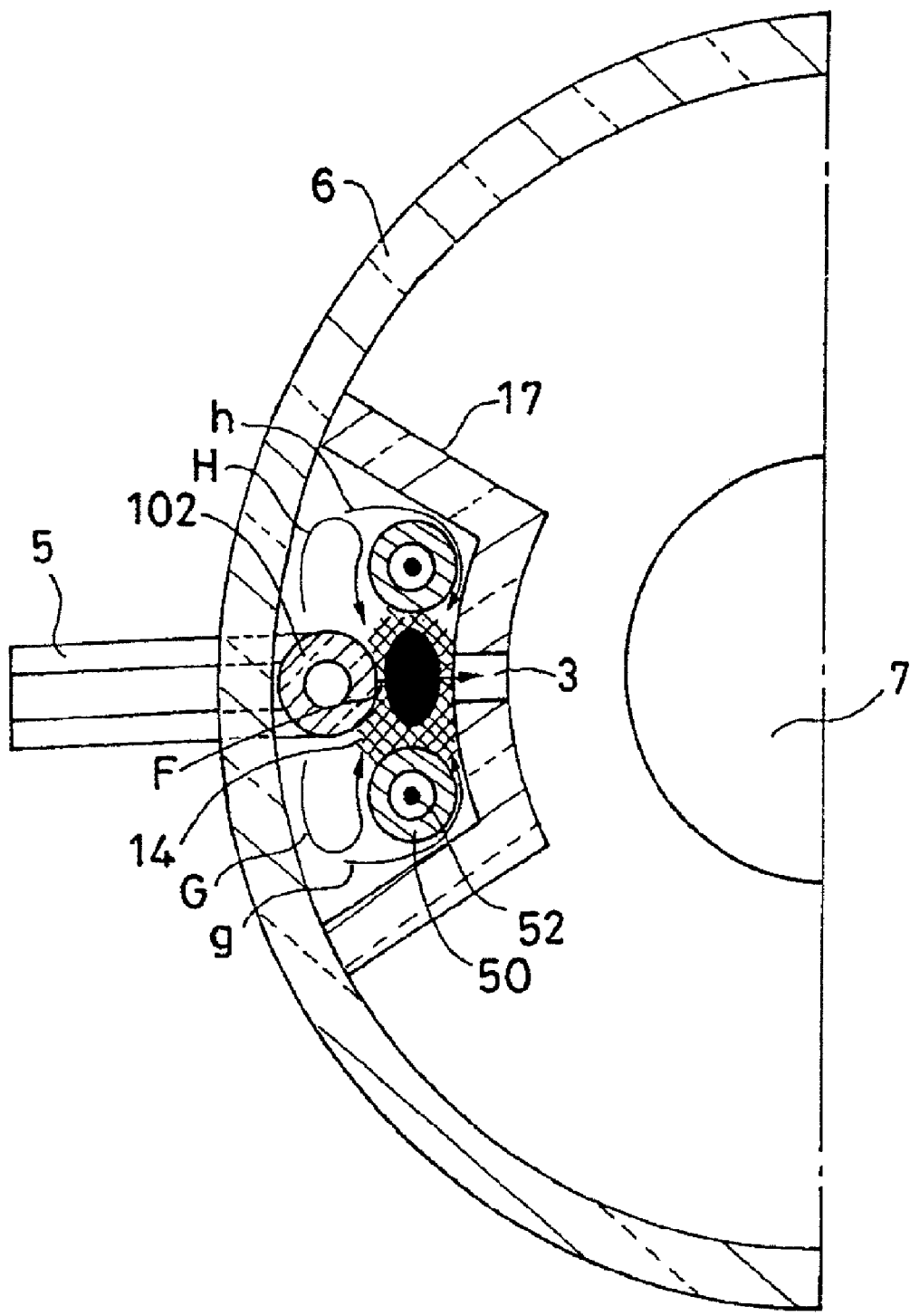
FIG. 11 is a lateral partial sectional view of a reaction tube of a substrate processing apparatus according to a seventh embodiment of the present invention.
Figure 12:
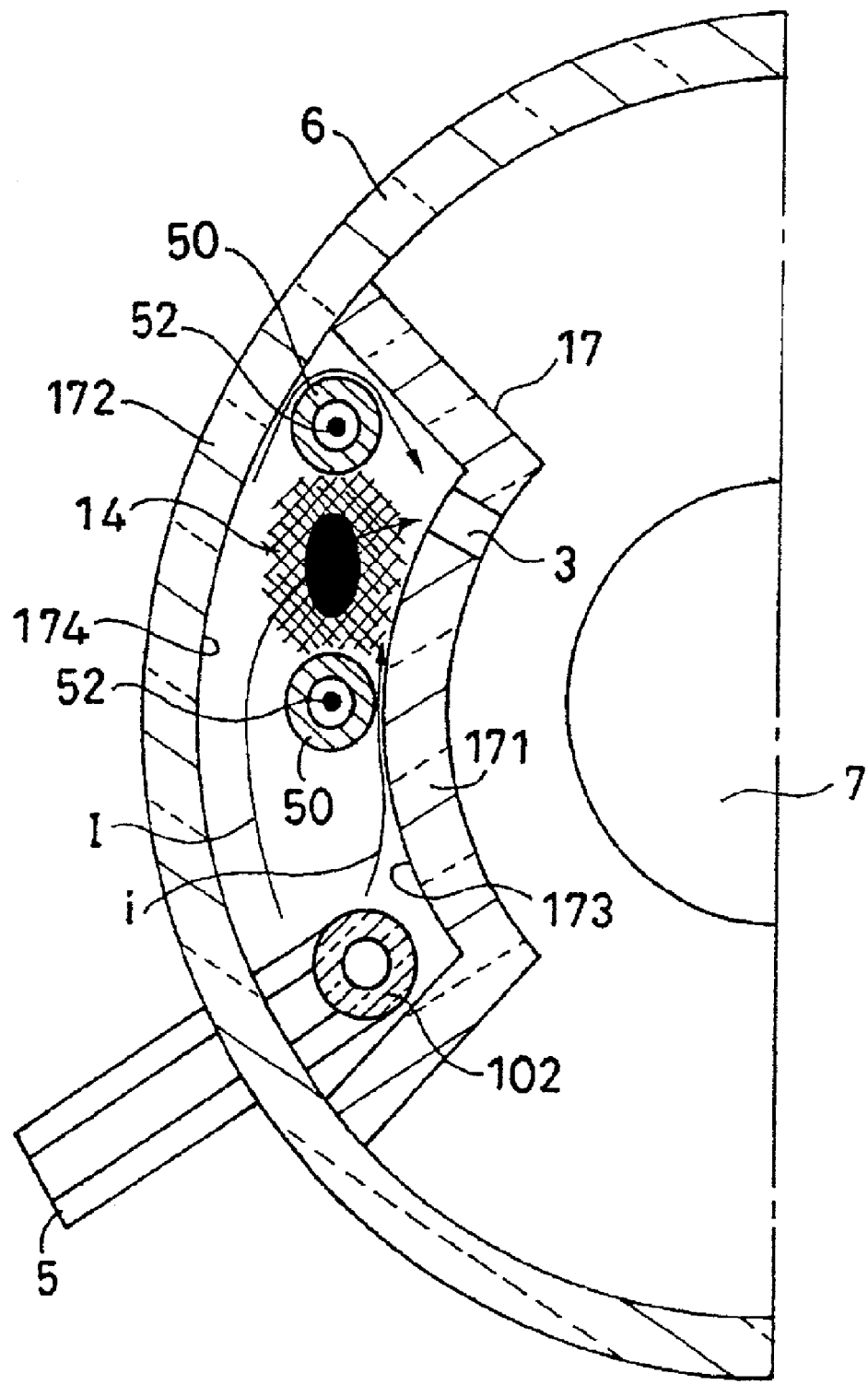
FIG. 12 is a lateral partial sectional view of a reaction tube of a substrate processing apparatus according to a eighth embodiment of the present invention.

Sixth to eighth embodiments of the present invention will be explained with reference to FIGS. 10, 11 and 12. FIGS. 10, 11 and 12 are lateral sectional views of left halves of reaction tubes 6 used for substrate processing apparatuses of the sixth, seventh and eighth embodiments of the invention, respectively.

In the sixth, seventh and eighth embodiments shown in FIGS. 10, 11 and 12, respectively, a gas nozzle 102 is disposed in the buffer chamber 17 from the lower portion to the upper portion of the reaction tube 6 in the stacking direction of the wafers 7. The gas introducing opening 5 is in communication with a lower portion of the gas nozzle 102. A large number of gas nozzle holes (not shown) are provided in the gas nozzle 102 in the vertical direction. Like the first to fifth embodiments, the exhaust opening which is in communication with an exhaust pump (not shown) is formed in a side surface of a lower portion of the reaction tube 6.

In the sixth embodiment shown in FIG. 10, a wall 172 which is a portion of the buffer chamber 17 is a portion of a wall of the reaction tube 6. Two electrode-protecting tubes 50 are disposed closer to a wall surface 173 of a portion of a wall 171 of the buffer chamber 17 provided with the buffer chamber holes 3 than a wall surface 174 of the wall 172. Two electrodes 52 protected by the two electrode-protecting tubes 50 are also disposed closer to the wall surface 173 of the wall 171 than the wall surface 174 of the wall 172. The two electrode-protecting tubes 50 are located in the vicinity of the wall 171 of the buffer chamber 17 provided with the buffer chamber holes 3 (preferably, a distance between the electrode-protecting tubes 50 and the wall surface of the wall 171 of the buffer chamber 17 is 0 to 5 mm. Here, 0 mm means a case in which the electrode-protecting tubes 50 are tightly connected to the wall surface). The two electrodes 52 and the two electrode-protecting tubes 50 are disposed astride the buffer chamber holes 3 (that is, the buffer chamber holes 3 are located between the two electrode-protecting tubes 50). With this arrangement, a distance between the plasma 14 and the buffer chamber hole 3 can be shortest.

If the two electrode-protecting tubes 50 are brought close to the wall surface 173 of the wall 171 constituting the buffer chamber 17, it is possible to limit a main gas flow path. If the buffer chamber holes 3 are provided at location where the limited main gas flow path passes between the two electrode-protecting tubes 50, the reaction gas can efficiently pass through a region where the concentration of the plasma 14 is high, and it is possible to increase the concentration of the active species.

In the case of FIG. 10, the reaction gas path in the buffer chamber 17 can roughly be divided into paths D, E, e and f. The paths D and E are main gas flow path, and most of reaction gas passes between the two electrode-protecting tubes 50, i.e., passes through the region where the concentration of the plasma 14 is high.

Since the plasma 14 and the buffer chamber holes 3 are located very close to each other, and unnecessary swelling portion becomes minimum. Therefore, deactivation of active species generated in the paths D and E can be suppressed as low as possible. Even if the active species are deactivated before the active species enter the buffer chamber holes 3, the active species can be activated again by the plasma 14.

The paths e and f which do not pass between the two electrode-protecting tubes 50 also pass near the plasma 14 just in front of the buffer chamber holes 3. Therefore, the concentration of the active species is increased, and deactivation of active species until the active species are introduced into the reaction tube 6 is small like the paths C and D.

That is, according to this embodiment, the following points become possible.
1) The active species can be activated with plasma having high concentration (concentration of the active species is increased at the time of excitation)
2) A substrate to be processed (wafer) can be carried without deactivating the active species.

This embodiment also has a feature that it is unnecessary to control the gas flow paths before the gas is brought into active species so that concentration of the active species is not different in the paths D and E.

If the electrode-protecting tubes 50 and the buffer chamber 17 are brought into tight contact with each other, since the paths e and f are cut off, and the gas paths can be limited to the paths D and E. This is effective because the active species having high concentration are supplied to a substrate. There is no clearance for the paths e and f. This is preferable because there is no variation in concentration of reaction gas active species between apparatuses.

FIG. 11 shows the seventh embodiment. In this embodiment, the gas nozzle 102 and the buffer chamber holes 3 are disposed between the two electrode-protecting tubes 50 so that gas supplied from the gas nozzle 102 straightly pass through (path F), the plasma 14 and the buffer chamber holes 3. In this structure, the concentration of the active species can be increased like the structure shown in FIG. 10.

FIG. 12 shows the eighth embodiment. In this embodiment, one of the two electrode-protecting tubes 50 is brought close to the wall surface 173 of the wall 171 provided with the buffer chamber holes 3, and the other electrode-protecting tube 50 is brought close to the wall surface 174 of the portion of the wall 172 of the buffer chamber 17 which is the portion of the wall of the reaction tube 6, so that the main gas flow path is limited. The The buffer chamber holes 3 are provided at locations where the main gas flow path I passes between the two electrode-protecting tubes 50.

If this embodiment shown in FIG. 12 is compared with the embodiments shown in FIGS. 10 and 11, a distance between the plasma 14 and the buffer chamber hole 3 becomes long and correspondingly, a swelling portion is generated, but the deactivation can be reduced by bringing one of the electrode-protecting tubes 50 closer to the wall surface 173 of the wall 171 constituting the buffer chamber 17.

As described above, the concentration of the active species of the reaction gas can be increased by optimizing the layout of the buffer chamber 17, the electrode-protecting tubes 50 and the buffer chamber holes 3.

The concentration of the active species of the reaction gas can be enhanced by optimizing the relative position of the buffer chamber 17, the electrode-protecting tubes 50 and the buffer chamber holes 3 as described above. When the processing uniformity between apparatuses, the reliability and repeatability are taken into consideration, it is preferable that there is no variation in the relative position.

In the above example, since the electrode-protecting tubes 50, the buffer chamber 17 and the buffer chamber holes 3 are independent from one another, an assembling error is generated and thus, it is considered that the concentration of the active species of the reaction gas is varied between the apparatuses.

Therefore, if a reaction tube in which the reaction tube 6, a wall constituting the buffer chamber 17, the buffer chamber holes 3 and the electrode-protecting tubes 50 are integrally formed is used, it is possible to suppress the variation. There is no problem if these elements are made of quartz and integrally welded to each other.

In the above example, the positions of the electrode-protecting tubes 50 are explained because the electrode-protecting tubes 50 are used, but when the electrode-protecting tubes 50 are not used, the electrodes 52 should be located at same positions of the electrode-protecting tubes 50.

If the structures shown in the sixth to eighth embodiments are used, the apparatus can be used as the CVD apparatus like the first embodiment, and if a buffer chamber 42 is added in addition to the buffer chamber 17 as shown in FIG. 6, the apparatus can be used as the ALD apparatus.

Ninth Embodiment

Figure 13:
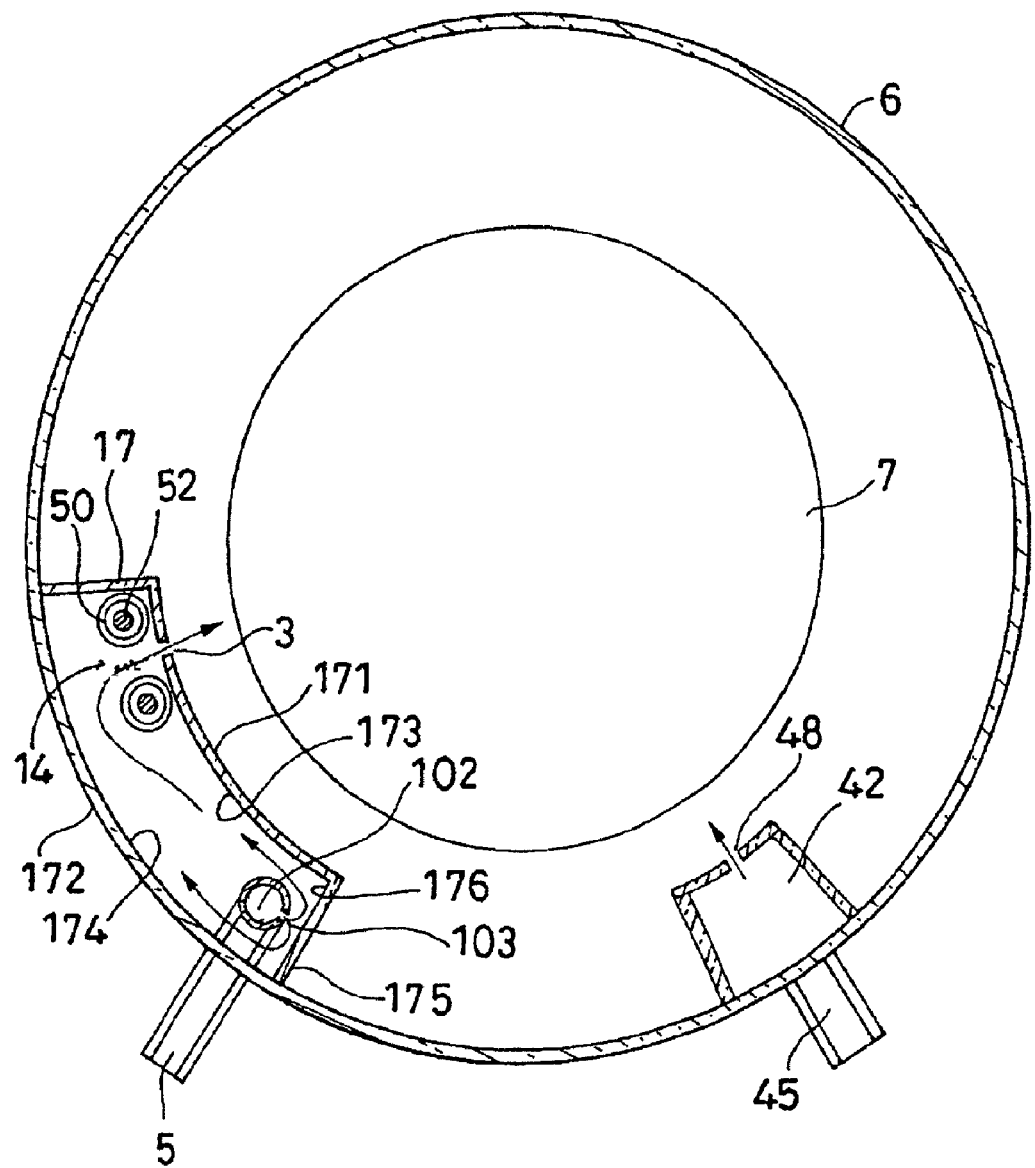
FIG. 13 is a lateral sectional view of a reaction tube of a substrate processing apparatus according to a ninth embodiment of the present invention.
Figure 14:
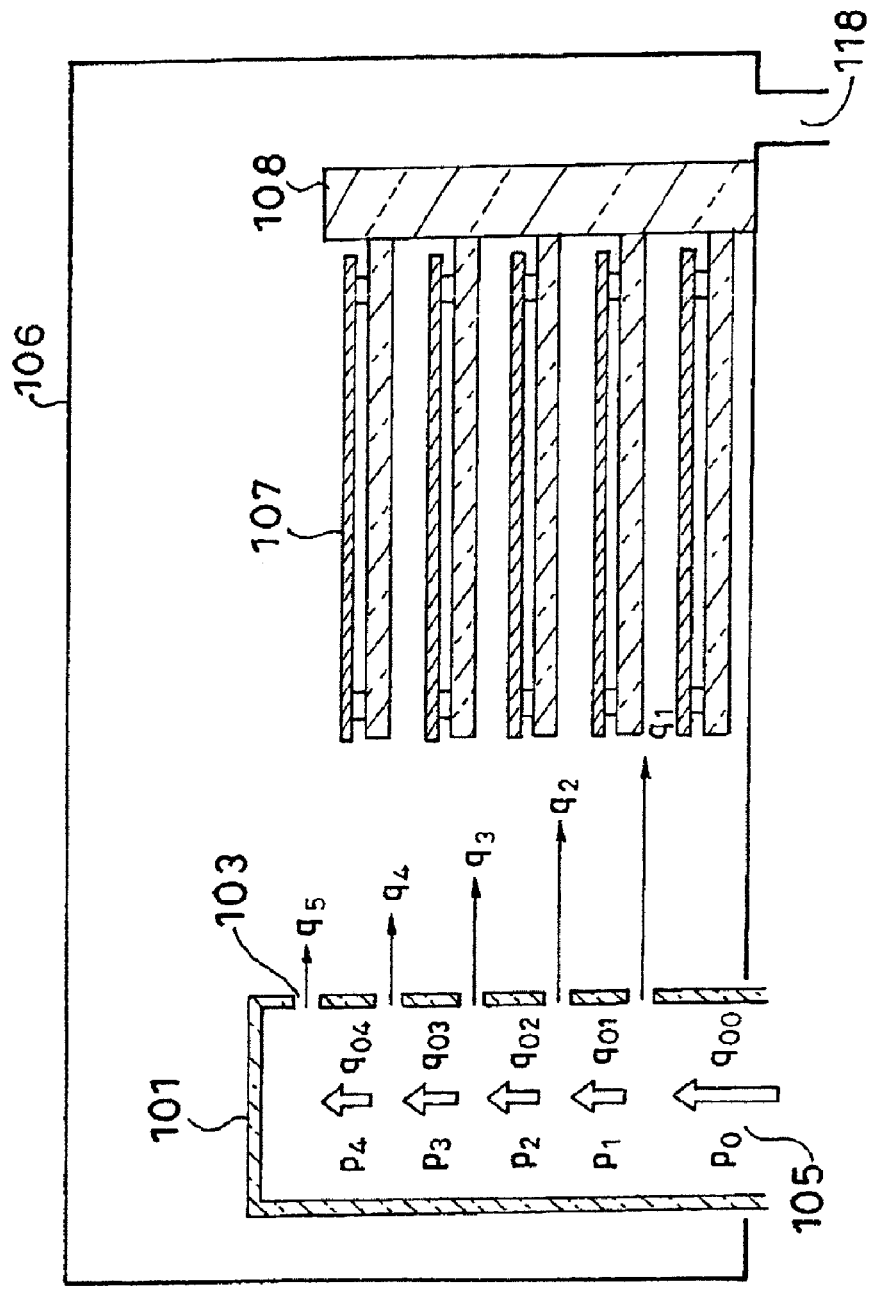
FIG. 14 is a schematic sectional view of a inside of a reaction tube of a substrate processing apparatus according to a conventional technique.

A ninth embodiment of the invention will be explained with reference to FIG. 13. In this embodiment, the buffer chamber 42 shown in FIG. 6 is added to the apparatus of the sixth embodiment shown in FIG. 10, and the apparatus is formed into the ALD apparatus.

The gas nozzle 102 is provided with a large number of gas nozzle hole 103 in the vertical direction. The gas nozzle holes 103 is provided toward a wall surface 176 of a wall 175 of the buffer chamber 17. If gas nozzle holes 103 are provided toward the inside of the buffer chamber 17 which is on the other side from the wall surface 176, when silicon nitride films are to be formed using the ALD method by alternately supplying ammonia from the gas nozzle 102 and dichlorsilane from the buffer chamber 42 like the second embodiment, and when ammonia stays and dichlorsilane flows, reaction by-product is generated, which becomes a cause of particles. Therefore, the gas nozzle holes 103 are directed toward the wall surface 176 of the wall 175 of the buffer chamber 17, and after ammonia is supplied, the chamber is purged with inert gas for not allowing ammonia to stay and for preventing particles from being generated.

In the sixth to eighth embodiments, the gas nozzle 102 is provided at its side surface with the large number of gas nozzle holes (not shown) in the vertical direction. In the ninth embodiment, the gas nozzle 102 is provided at its side surface with the large number of gas nozzle holes 103. The gas nozzle 102 may have a predetermined length, and the gas nozzle holes may be opened at the upper portion of the gas nozzle 102. In this case, it is preferable that a height of the gas nozzle 102 is lower than the loading position of the wafer 7.

The entire disclosures of Japanese Patent Application No. 2002-104011 filed on Apr. 5, 2002 and Japanese Patent Application No. 2002-203397 filed on Jul. 12, 2002 including specifications, claims, drawings and abstracts are incorporated herein by reference in their entireties.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus, comprising:
a reaction tube having an inner wall which forms a reaction chamber which is to accommodate stacked substrates;
a buffer chamber having a buffer chamber hole which is adjacent to the substrates, the buffer chamber being provided in an arc space between substrates and the inner wall of the reaction tube along the stacking direction of the substrates and being disposed on the inner wall of said reaction tube;
a first gas introducing section having a first gas supply hole, the first gas introducing section being provided in the buffer chamber;
a second gas introducing section having a second gas supply hole, the second gas introducing section being provided in the arc space between substrates and the inner wall of the reaction tube along the stacking direction of the substrates and being disposed on the inner wall of the reaction tube; and
electrodes, disposed in said buffer chamber, to generate plasma which is to activate a first substrate processing gas, wherein
said first gas introducing section supplies said first processing gas into said buffer chamber via said first gas supply hole,
said buffer chamber forms a space therein to activate said first processing gas by said electrodes and supplies said activated first processing gas via said buffer chamber hole into said reaction chamber, and
said second gas introducing section supplies a second processing gas, which is not activated and different from said first processing gas, directly into said reaction chamber via said second gas supply hole.

2. A substrate processing apparatus, comprising:
a reaction tube which forms a reaction chamber which accommodates stacked substrates;
a gas introducing section; and
a buffer chamber provided in said reaction tube, wherein said gas introducing section is provided with at least one gas introducing opening that introduces substrate processing gas into said buffer chamber,
said buffer chamber includes at least one gas-supply opening and said processing gas introduced from said gas introducing section is supplied from said gas-supply opening into said reaction chamber, and
rod-shaped electrodes that generate plasma which activates said substrate processing gas are disposed within said buffer chamber at intermediate positions of a flow of said processing gas which is formed in said buffer chamber and which flows from said gas introducing opening to said gas-supply opening, said electrodes being oriented such that they extend in a direction perpendicular to the direction of gas flow from said gas introducing opening to said gas-supply opening; and
where all electrodes within said buffer chamber are rod-shaped electrodes.

3. A substrate processing apparatus, comprising:
a processing tube which forms a processing chamber in which a plurality of substrates is to be accommodated;
a first gas supply section which includes at least one first gas-supply opening and is provided in said processing tube;

a second gas supply section which includes at least one second gas-supply opening;

a third gas supply section which includes at least one third gas-supply opening; and electrodes, disposed in said first gas supply section, to generate plasma; wherein a first substrate processing gas, which is supplied into said processing chamber in an activated state and which is supplied into said second gas supply section, is supplied from said second gas-supply opening into said first gas supply section, and said first processing gas supplied from said second gas supply section is activated in said first supply section and is supplied from said first gas-supply opening into said processing chamber, a second substrate processing gas, which is not activated and which is supplied into said third gas supply section, is supplied from said third gas-supply opening directly into said processing chamber; and the first and second processing gases are supplied into the processing chamber alternately to form a film on the substrates.

4. A substrate processing apparatus, comprising:

a processing tube which forms a processing chamber in which a plurality of substrates are to be accommodated;

a first gas supply section which includes at least one first gas-supply opening and is provided in said processing chamber;

a second gas supply section which includes at least one second gas-supply opening; and a third gas supply section which includes at least one third gas-supply opening, wherein a first substrate processing gas, which is supplied into said processing chamber in an activated state and which is supplied into the second gas supply section, is supplied from said second gas-supply opening into said first gas supply section, and said first processing gas supplied from said second gas supply section is supplied from said first gas-supply opening into said processing chamber, a second substrate processing gas, which is not activated and which is supplied into said third gas supply section, is supplied from said third gas-supply opening directly into said processing chamber, and electrodes to generate plasma which is to activate said first processing gas are disposed in said first gas supply section and at intermediate positions of a flow of said first processing gas flowing from said second gas-supply opening to said first gas-supply opening.

5. The substrate processing apparatus of claim 1, wherein all the electrodes in the buffer chamber are rod-shaped electrodes.

6. The substrate processing apparatus of claim 1, wherein the first gas introducing section is a hollow cylinder.

7. The substrate processing apparatus of claim 2, wherein the first gas introducing section is a hollow cylinder.

8. The substrate processing apparatus of claim 3, wherein the electrodes within the first gas supply section are all rod-shaped electrodes.

9. The substrate processing apparatus of claim 3, wherein the second gas supply section is a hollow cylinder.

10. The substrate processing apparatus of claim 4, wherein the electrodes within the first gas supply section are rod-shaped electrodes.

11. The substrate processing apparatus of claim 4, wherein the second gas supply section is a hollow cylinder.

* * * * *